(12) United States Patent
Diehl

(10) Patent No.: US 7,417,435 B2
(45) Date of Patent: Aug. 26, 2008

(54) METHOD FOR GENERATING A HOMOGENEOUS MAGNETIZATION IN A SPATIAL EXAMINATION VOLUME OF A MAGNETIC RESONANCE INSTALLATION

(75) Inventor: Dirk Diehl, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 10/594,775

(22) PCT Filed: Mar. 22, 2005

(86) PCT No.: PCT/EP2005/051313

§ 371 (c)(1),
(2), (4) Date: Sep. 29, 2006

(87) PCT Pub. No.: WO2005/101046

PCT Pub. Date: Oct. 27, 2005

(65) Prior Publication Data

US 2007/0273375 A1    Nov. 29, 2007

(30) Foreign Application Priority Data

Apr. 13, 2004   (DE) .................. 10 2004 017 853

(51) Int. Cl.
*G01V 3/00* (2006.01)
*A61B 5/055* (2006.01)
(52) U.S. Cl. ............... 324/320; 324/318; 324/307; 324/309; 600/410; 600/422

(58) Field of Classification Search ......... 324/300–322; 600/410, 411, 422
See application file for complete search history.

(56) References Cited

U.S. PATENT DOCUMENTS

| | | | | | |
|---|---|---|---|---|---|
| 4,707,668 | A | * | 11/1987 | Hoffert | 330/56 |
| 5,179,332 | A | * | 1/1993 | Kang | 324/313 |
| 5,557,247 | A | * | 9/1996 | Vaughn, Jr. | 333/219 |
| 5,886,596 | A | * | 3/1999 | Vaughan, Jr. | 333/219 |
| 6,900,636 | B2 | | 5/2005 | Leussler | 324/318 |
| 7,084,629 | B2 | * | 8/2006 | Monski et al. | 324/318 |

(Continued)

FOREIGN PATENT DOCUMENTS

EP      1 273 926      6/2002

(Continued)

*Primary Examiner*—Brij B. Shrivastav
*Assistant Examiner*—Tiffany A Fetzner
(74) *Attorney, Agent, or Firm*—Schiff Hardin LLP

(57) ABSTRACT

In a method and magnetic resonance apparatus wherein a homogenous magnetization is generated in a spatial examination volume of the apparatus during examination of a subject, individual resonator segments of a body coil, that are electromagnetically decoupled from each other, are separately activated by a control and evaluation device according to sets of predetermined segment-specific excitation parameters stored in the control and evaluation device. The resonator segments are temporally sequentially excited in an excitation sequence, using different excitation parameter sets with phase distributions of the nuclear magnetization distributions in the examination volume constructively superimposing to form a resulting homogenous entire nuclear magnetization distribution in the examination volume.

8 Claims, 3 Drawing Sheets

U.S. PATENT DOCUMENTS

| | | | |
|---|---|---|---|
| 7,215,120 B2 * | 5/2007 | Vaughan | 324/318 |
| 7,221,162 B2 * | 5/2007 | Feiweier et al. | 324/318 |
| 7,345,483 B2 * | 3/2008 | Vaughan | 324/318 |
| 2004/0051529 A1 * | 3/2004 | Zhu et al. | 324/318 |
| 2005/0099179 A1 * | 5/2005 | Monski et al. | 324/318 |
| 2005/0140369 A1 * | 6/2005 | Feiweier et al. | 324/318 |
| 2007/0066885 A1 * | 3/2007 | Vaughan | 600/411 |
| 2007/0085543 A1 * | 4/2007 | Vaughan | 324/318 |
| 2007/0132454 A1 * | 6/2007 | Vaughan | 324/318 |
| 2007/0273375 A1 * | 11/2007 | Diehl | 324/309 |
| 2008/0024133 A1 * | 1/2008 | Vaughan et al. | 324/318 |

FOREIGN PATENT DOCUMENTS

| | | | |
|---|---|---|---|
| WO | WO 01/86324 A1 | 11/2001 | |

* cited by examiner

US 7,417,435 B2

METHOD FOR GENERATING A HOMOGENEOUS MAGNETIZATION IN A SPATIAL EXAMINATION VOLUME OF A MAGNETIC RESONANCE INSTALLATION

BACKGROUND OF THE INVENTION

1. Field of the Invention

The invention concerns a method for generation of a homogeneous magnetization in a spatial examination volume of a magnetic resonance system during a subject examination, the magnetic resonance system having a body coil formed by a number of resonator segments and a control and evaluation device for separate activation, corresponding to a set of predetermined, segment-specific excitation parameters, of the individual resonator segments, that are electromagnetically decoupled from one another.

2. Description of the Prior Art

Magnetic resonance tomography is one of the imaging methods in medical diagnostics that utilizes the interaction of an external field (here a magnetic field) with the human body for imaging. The design and the functionality of such a magnetic resonance system is known and does not have to be described in detail.

In earlier times, magnetic resonance systems were also produced in which the basic magnetic field was more than 1.5 T, in particular 3 T and more. Better resolutions can be achieved with these magnetic resonance systems, but inhomogeneities of the image quality occur that are ascribed to inhomogeneities in the excitation field generated by the body coil.

A magnetic resonance system is known from EP 1 279 968 A2 in which, according to the system design described above, resonator segments that are electromagnetically decoupled from one another are provided that form the body coil. Here the individual resonator segments can resonate independently of one another at the desired resonance frequency. A separate transmission channel is associated with each resonator segment, meaning that each resonator segment can be activated separately. The generation of separate individual fields that, in combination, produce the circularly-polarized radio-frequency magnetic field, is possible. The amplitude and the phase of each individual transmission channel can be adjusted correspondingly.

As described, the image quality in magnetic resonance systems depends to a considerable degree on the homogeneity of the spatial distribution of the component of the circularly-polarized radio-frequency magnetic field that effects the deflection of the spins from the equilibrium state. Especially at higher frequencies, the homogeneity of the magnetic field is no longer significantly influenced solely by the currents at the antennas, but also by the currents in the patient's body. The activation of the resonator segments ensues using an established excitation parameter set that, with regard to the amplitudes and phases of the activation signals of the individual resonator segments, is selected to obtain an optimally homogeneous magnetic field.

A central problem in the framework of the MR examination with a comparably strong basic magnetic field is the patient exposure that exists due to the very high operating frequencies of the excitation magnetic field, which patient exposure is caused by power losses absorbed by the patient. For example, if a basic magnetic field of 3 T is used, the frequency of the circularly-polarized excitation magnetic field is, for example, 128 MHz. More severe inhomogeneities result from the high frequency and the low penetration depth of the magnetic field associated therewith, which severe inhomogeneities lead to the situation that the spin flip across the examination volume is not sufficient. However, a more severe heating of the body additionally results therefrom due to the high energy application. This increased energy application can not be arbitrarily high locally with regard to the examination volume nor globally with regard to the examination subject. In the MR examination, limit values are taken into account in order to avoid over-exposing the patient. The local specific absorption rate (SAR) concerns the local energy application per weight unit and is specified as a power loss density per kilogram of weight while the global absorption rate represents the sum of the local absorption rates over the entire examination subject. For example, the global absorption rate can lie below the limit value while the local absorption rate exceeds the limit value at a specific point of the examination volume and a local burning of the patient can occur.

The goal of an optimally homogeneous excitation magnetic field thus is in conflict with the problem of the patient exposure that limits the acquisition possibilities given excitation with a predetermined excitation parameter set that would lead to a very homogeneous magnetic field.

SUMMARY OF THE INVENTION

An object of the invention is to provide a method for generation of a homogeneous, radio-frequency magnetic field that allows a very good homogenization of the field distribution within a spatial examination volume while also reducing the exposure of the patient.

This object is achieved in accordance with the invention by a method wherein the resonator segments are temporally sequentially excited using different excitation parameter sets within an excitation sequence. The excitation parameter sets should cause phase distributions of the nuclear magnetization distributions in the examination volume to constructively overlap so as to form a resulting (at least predominantly) homogeneous overall nuclear magnetization distribution. Constructive overlapping means that the nuclear magnetization (which is synonymous with the flip angle) is additively built up in steps at each location of the examination volume with each further excitation pulse that is caused to be emitted by the different excitation parameter sets, in order to ultimately obtain the desired overall nuclear magnetization that can be achieved in the framework of the concrete experimental possibilities with corresponding precision, thus the at least largely homogeneous total nuclear magnetization. An essentially equal phase distribution of the nuclear magnetization or of the flip angle in the examination volume is a requirement for the possibility of the constructive (thus additive in steps) superimposition of the sequentially-applied excitation pulses that exhibit different excitation parameter sets. An essentially identical (i.e. in the framework of the concrete, experimental possibilities with corresponding precision) phase distribution of the resulting flip angle of the precessing nuclear magnetization in the examination volume thus results.

The invention is based on effecting the excitation during the entire excitation time without using an individual excitation parameter, but rather using a number of excitation parameter sets for this purpose. The excitation ensues in temporal sequence using the different excitation parameters, meaning that the entire excitation sequence is fractionalized into an arbitrary plurality of different time windows. Within each time window a different excitation parameter set is used for excitation in comparison to the previous time window. A sub-pulse excitation thus ensues instead of the excitation known in the prior art with only one pulse with defined excitation parameter set that is retained during the entire excitation cycle.

Because a different magnetic field builds up with each excitation parameter set, the respective local energy application in the examination volume is consequently different. Because the locations of the local energy application change with each newly-employed excitation parameter set, thus from sub-pulse to sub-pulse, during the overall excitation sequence a localized overheating does not occur can lead to local burnings. This means that the individual local energy application during the very short excitation duration with a specific parameter set is very low and is not sufficient to lead to the described unallowable heating. This is avoided by the high-frequency changing of the excitation parameter sets. It follows from this that the power loss can be minimized, meaning that the radio-frequency exposure limit values of the patient can be significantly exhausted during the entire excitation in order, for example, to achieve a faster image acquisition.

The flip angle develops in steps up to the maximum desired resulting flip angle; the magnetization also builds up in steps along with this; the individual fields that are generated with each individual excitation set overlap one another. Because excitation parameter sets are used that exhibit phase distributions of the nuclear magnetization distributions in the examination volume that constructively overlap into the resulting overall nuclear magnetization in the examination volume, in spite of different excitation parameter sets a flip angle amplitude distribution that is homogeneous in practice (and with this a homogeneous field) is developed, but with a distinctly lower local SAR exposure.

As described, the selection of the different excitation parameter sets used should be such that the phase distribution of the flip angle in the overall area of the combined sets coincides, consequently a constructive interaction is thus achieved such that a homogeneous flip angle amplitude distribution occurs in turn. At the same time the mutually overlapping, parameter set-specific individual fields should exhibit an optimally homogeneous magnetic field distribution, but different SAR distributions. As a consequence, the excitation parameter sets to be used are appropriately selected dependent on the homogeneity of the set-specific magnetic field. This means that a detection of the homogeneity of the generated field forming the basis of an excitation parameter set ensues initially with regard to the examination volume, after which from the entire assemblage of the excitation parameter sets those are selected that are optimally homogeneous and that can be used with regard to the flip angle phase distribution.

The selection of the usable amplitude-phase sets can particularly advantageously ensue with a method as described in the subsequently-published German patent application DE 103 50 069.3. An optimization method is described therein for generation of amplitude-phase sets that lead to a very homogeneous radio-frequency magnetic field that, according to a first invention embodiment: wherein (given subject located in the system) all individual resonator segments are initially excited using defined excitation parameters and the respective, segment-specific magnetic field distribution in the examination volume are determined; after which a calculational superimposition of the segment-specific magnetic field distributions ensues for determination of the overall field distribution in the examination volume. The overall field distribution is subsequently evaluated with regard to the homogeneity using an evaluation algorithm; and a determination of possible changes of one or more excitation parameters of one or more resonator segments for compensation of an established field inhomogeneity subsequently ensues. In addition to the real excitation of the resonator segments upon the introduction of an examination subject, a corresponding parameter set generation can also ensue on the basis of a simulation of the resulting segment-specific magnetic field distributions relative to the individual resonator segments, given an assumed separate excitation of every individual resonator segment with defined excitation parameters by a control and processing device using a simulation model of the magnetic resonance system and of the examination subject. In this case the simulated field distributions also overlap and an overall field is determined that is subsequently evaluated with regard to homogeneity and they are determined with regard to the excitation parameters relative to the possible changes.

A notably large assemblage of different excitation parameter sets with different amplitude-phase combinations that respectively lead to different fields can thus be collected in this manner, from which assemblage those amplitude-phase sets are then selected (dependent on the respective set-specific field inhomogeneity) that are used in the framework of the inventive method.

According to a first invention embodiment it is possible to excite the respective examination volume in its entirety on the basis of the respective excitation parameter set chronologically employed within the entire excitation frequency. By contrast, an alternative in accordance with the invention provides that the examination volume is sub-divided into a number of sub-volumes. A number of different excitation parameter sets to be used for sequential activation of the resonator segments are used for each sub-volume. According to this invention embodiment an additional division of the examination volume into two or more sub-volumes thus ensues. A number of different excitation parameter sets with properties that are the same (as described above; namely field inhomogeneity corresponding to one another as well as coinciding phase distribution of the flip angle in the sub-region) is associated with each sub-volume. Here as well a number of sets can thus be determined for each sub-region (for example also on the basis of the optimization method described above from the subsequently-published German patent application DE 103 50 069.3) these set can achieve an optimally large flip angle amplitude distribution in the respective sub-region in order to excite with optimal efficiency within the available time and in order to achieve optimally quickly the step-by-step development of the flip angle (and therewith of the magnetization), which sets lead to a largely homogeneous flip angle amplitude distribution in the sub-region. Here as well the flip angle phase distribution in the entire examination volume should be such that a constructive superimposition of the nuclear magnetizations is achieved. This means that a parameter set assemblage is initially determined whose flip angle amplitude in the respective sub-region is optimally large as well as whose flip angle amplitude distribution in the respective sub-region is essentially (insofar as it is experimentally possible) homogeneous, from which set assemblage those parameter sets are subsequently selected that are characterized by largely coinciding flip angle phase distribution in the overall region and primarily by a low power loss.

Using the parameter sets determined in this manner, the individual sub-pulses are now presented under temporally sequential (thus successive) utilization of the determined different, sub-volume-specific sets. The individual flip angles and therewith the local sub-volume fields complement one another such that a homogeneous magnetization develops in the total volume. The sub-division into sub-regions thereby makes the homogenization easier, meaning that the number of existing amplitude-phase sets that are determined (for example with the optimization method from the subsequently-published German patent application DE 103 50 069.3) increase considerably with satisfactory homogeneity. From this large number a number of sets can now be found that are characterized by low power requirement, these sets particularly efficiently developing the magnetization in the sub-region. The combination of such selected sets now leads to a particularly low total power requirement when a largely phase-accurate constructive contribution to the increase of the flip angle of each sub-pulse in the total region is achieved. The collection of the relevant sets to be used, regardless of whether a total volume excitation or a sub-volume excitation now ensues, ensues via the control and evaluation device of the magnetic resonance system that for this exhibits corresponding detection and evaluation algorithms.

Given a sub-volume excitation it can furthermore be appropriate when the amplitude of an excitation parameter set to be used and/or the excitation duration are determined using an excitation set, and the phase shift of an excitation parameter set to be used is determined such that an essentially homogeneous flip angle amplitude distribution results in the total examination volume. After determination of the parameter sets to be used, an adaptation of the pulse strength thus ensues again, for example, with a further optimization algorithm, thus for example a change of the amplitude of all activation signals of a set by a common factor and/or an extension of the pulse duration and, for example, also a phase shift for the chronologically successive activation of the resonator segments with the selected amplitude-phase sets, such that a homogeneous flip angle amplitude distribution arises in the overall region.

For both excitation variants, namely the excitation of the entire volume or the sub-volume excitation, it is decisive that the phase distributions of the selected sets within the overall region to be optimized largely coincide in order to obtain a further positive gain in the flip angle at each location of the overall region after each sub-pulse, even when this overall region is composed of sub-regions.

Overall, using the inventive method the loss application in the patients can be reduced locally (given an excitation of the entire volume) or locally and globally (given an excitation of the entire volume or sub-volumes). The RF exposure of the patient reduced to achieve a predetermined flip angle can be better used under utilization of the SAR exposure limit values for adaptation of image acquisition sequences, for example for a faster image acquisition.

In addition to the inventive method, the invention also concerns a magnetic resonance system with a control and evaluation device fashioned for implementation of the described method.

DESCRIPTION OF THE PREFERRED EMBODIMENTS

Figure 1:
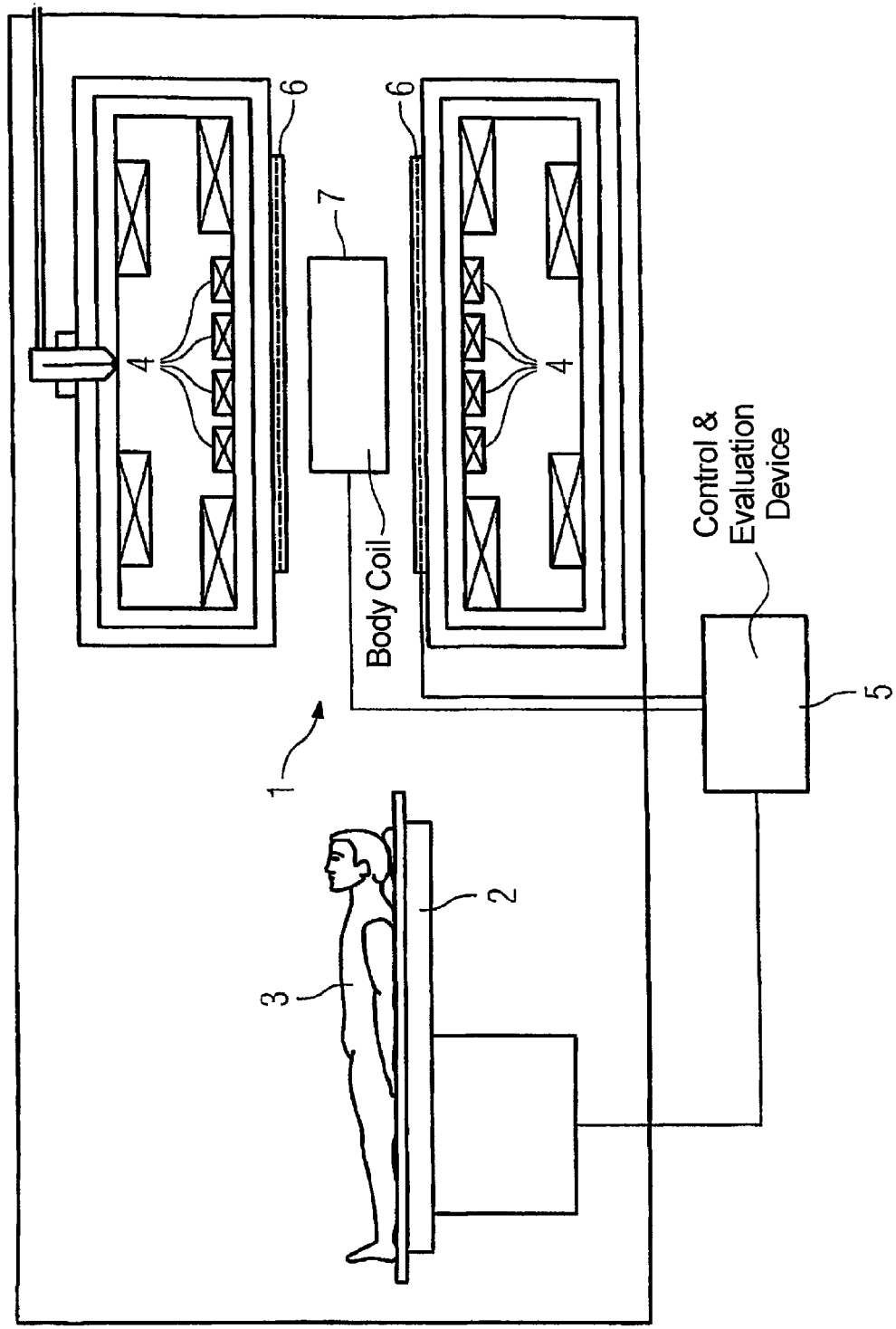
FIG. 1 shows the basic components of a magnetic resonance system.

FIG. 1 shows an inventive magnetic resonance system that has an examination region 1. An examination subject 4 (here a person) can be introduced into the examination region 1 by means of a patient bed 2. The examination region 1 in which the examination volume is situated is charged with a basic magnetic field by means of a basic field magnet 4. The basic magnetic field is temporally constant (static) and spatially as homogeneous as possible. It exhibits a magnetic field strength that is advantageously 3 T or more.

The basic field magnet 4 is advantageously fashioned as a superconductor. Thus no further activations are required via a control and evaluation device 5 via which the system operation is controlled.

The magnetic resonance system also has a gradient system 6 by means of which the examination region 1 can be charged with gradient magnetic fields. The gradient system 6 can be activated by the control and evaluation device 5 such that gradient currents flow in the gradient system 6.

The magnetic resonance system also comprises a body coil 7 (also known as a whole-body antenna) that normally accords a double function. It serves as a transmission antenna for field generation and as a reception antenna for acquisition of signals. The body coil 7 can be activated by the control and evaluation device 5 such that corresponding excitation currents flow in it according to the excitation parameters as they exist in the control and evaluation device 5.

The examination volume situated in the examination region 1 can be charged with a radio-frequency excitation magnetic field by means of the body coil 7. In the event that the examination subject 3 is introduced into the examination region 1, this examination subject 3 can thus be excited to magnetic resonance. In the shown system example the magnetic resonance signals so generated are then acquired via the body coil 7 that then operates as a reception antenna. The acquired magnetic resonance pulses are supplied to the control and evaluation device 5 and evaluated by this for generation of the magnetic resonance image that is output on a monitor (not shown in detail).

The quality of the magnetic resonance images depends on, among other things, the homogeneity of the excitation magnetic field generated via the body coil 7. In order to be able to generate an optimal excitation magnetic field with regard to the homogeneity, the individual resonator segments 8 of the body coil 7 can be activated separately, meaning that each resonator segment can be activated separately for field generation.

Figure 2:
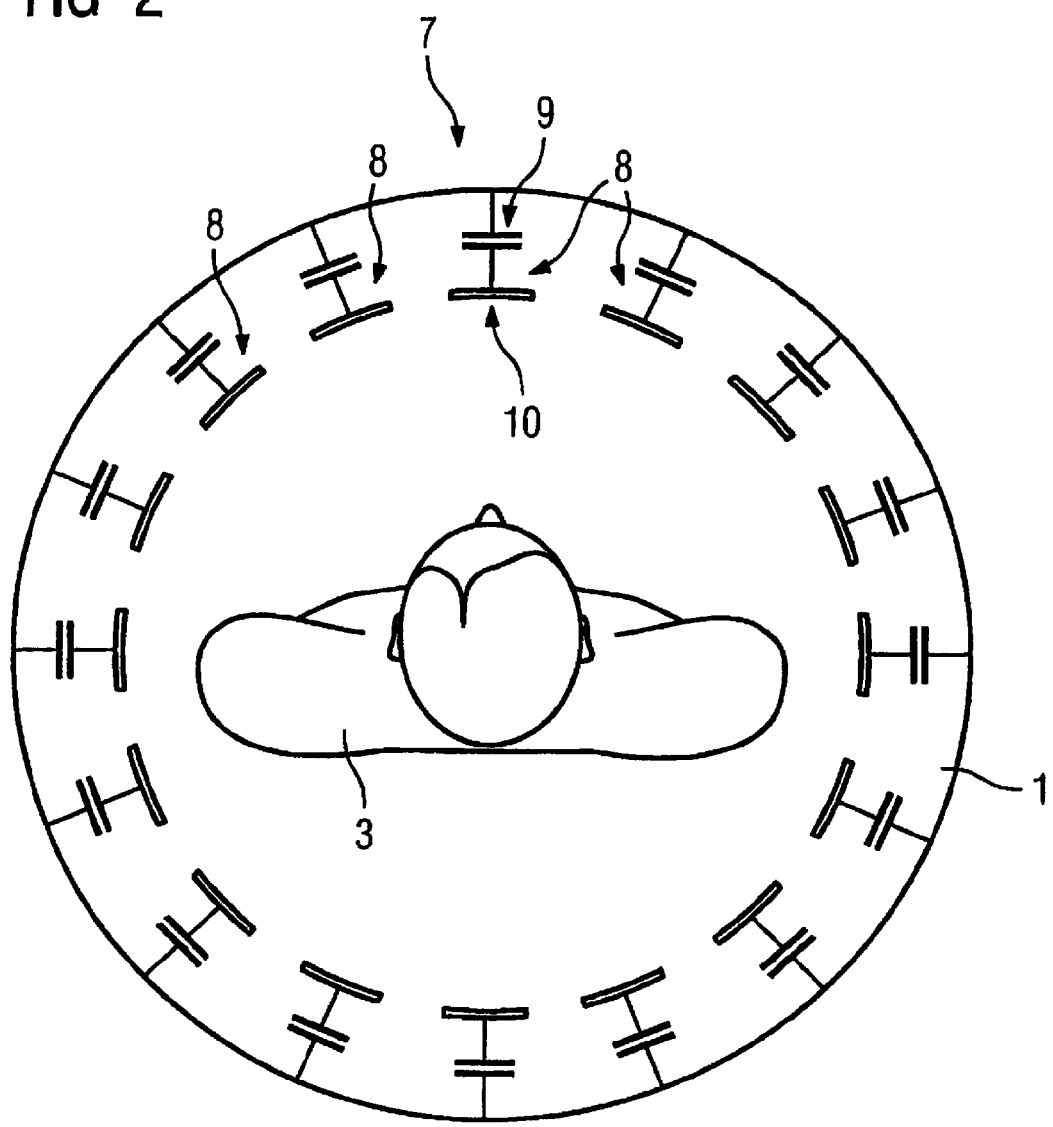
FIG. 2 shows a section through a body coil.

As FIG. 2 shows, a body coil 7 has a number of individual resonator segments; in the shown exemplary embodiment sixteen resonator segments 8 are provided. Each resonator segment comprises at least one capacitor 9 as well as a conductor element 10 that, for example, runs parallel to the longitudinal axis of the basic field magnet 4. A conductor element is appropriately fashioned as a band conductor. The resonator segments 8 are arranged such that they surround the examination region 1.

So that the resonator segments 8 can be activated separately, it is necessary to electromagnetically decouple them from one another. This can ensue in different manners. EP 1 279 968 A2 is an example, where various decoupling possibilities are described that can also be provided in the inventive magnetic resonance system (albeit not described here in detail).

Figure 3:
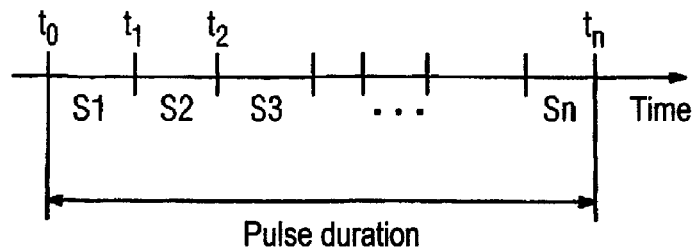
FIG. 3 illustrates the chronological activation of the body coil of FIG. 2 with n sub-pulses with respectively different excitation parameter sets within the total excitation sequence, in accordance with the invention.

FIG. 3 shows the inventive temporally-sequential activation mode as a schematic representation. The time axis is plotted; an entire excitation cycle is shown (characterized by the start and end points in time $t_0$ and $t_n$) that is sub-divided into n time windows. At a point in time $t_0$ the excitation of the resonator segments of the body coil (as FIG. 2 shows it) is implemented with a first excitation parameter set S1. The duration of this sub-pulse excitation is relatively short and ends at a point in time $t_1$, after which the excitation is continued using a different excitation parameter set S2 that leads to a similar field homogeneity as the parameter set S2, however is based on different excitation parameters. The sub-pulse S2 is applied up to the point in time $t_2$, after which the excitation parameter set S3 is switched to, which excitation parameter set S3 forms the basis of the excitation. In this manner the excitation continues using respective different excitation parameter sets up to the usage of the last parameter set Sn that forms the basis of the excitation at the point in time $t_n$, after which the excitation is ended altogether.

It should be noted that the excitation parameter sets do not all have to be different. It is also conceivable to use parameter sets multiple times. However in each case it is important that a sufficiently frequent change and a sufficient number of different parameter sets is used since, although each parameter set introduces local power losses into the examination region, these are differently situated locally, such that they do not coincide during the total cycle and do not mutually reinforce one another, and no locally unallowable energy applications occur.

As FIG. 3 also shows, it is not necessary that the duration of the individual sub-pulse is respectively the same. It is also conceivable that the one or another sub-pulse is shorter or longer than a preceding sub-pulse.

Figure 4:
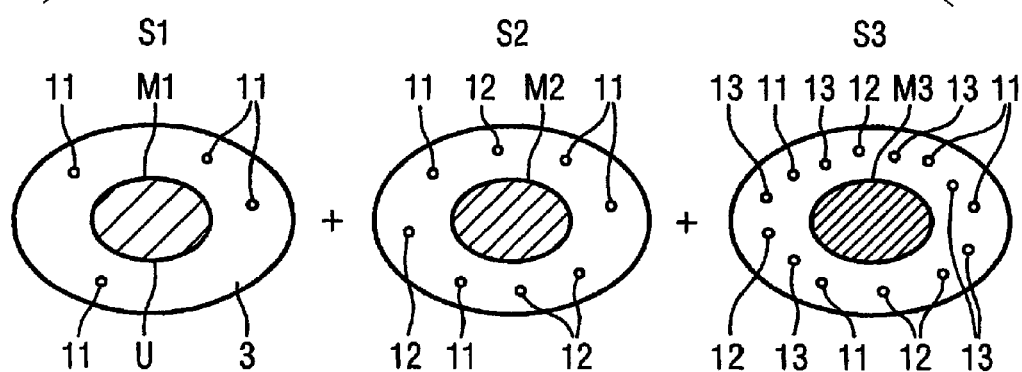
FIG. 4 illustrates the superimposition of the pulse-specific individual fields into a total excitation in the examination volume.
Figure 5:
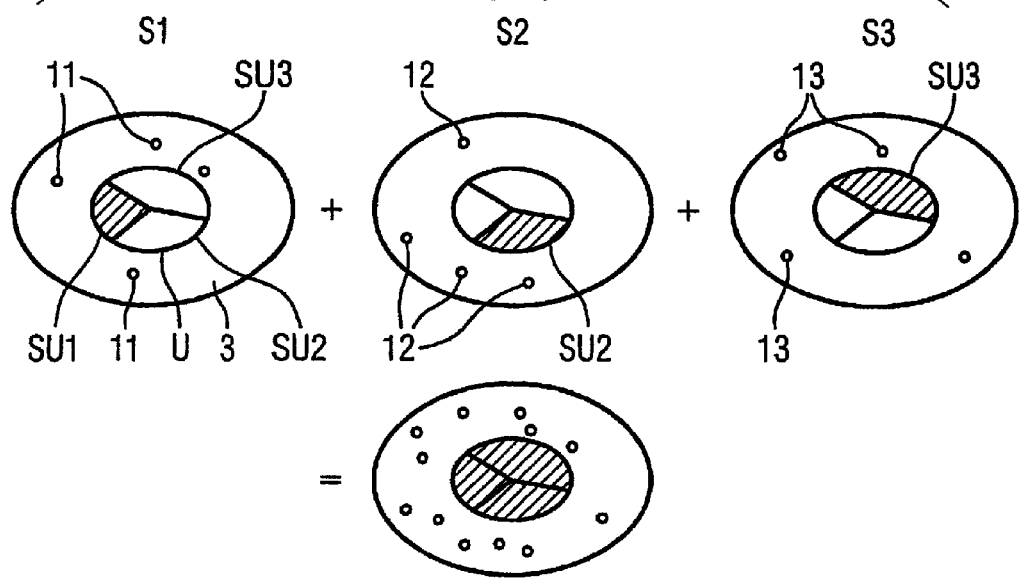
FIG. 5 illustrates the development of the magnetization in the entire examination volume given separate excitation of the magnetization in sub-volumes.

The mode of action of the different excitation modalities can be represented in principle using FIGS. 4 and 5. This is based on the fundamental idea that the flip angle is developed in steps, for which the individual sub-pulses serve whose phase distribution largely coincides in a total area to be optimized.

This is based on the following physical correlations:

In a magnetic resonance examination a strong basic magnetic field with the magnetic flux density B0 (for example 1.5 T or 3 T) provides for the precision of the nuclear magnetic moments with the Lamor frequency ω. It thereby applies:

ω=γ·B0, whereby γ designs the gyromagnetic ratio.

Averaged over the magnetic nuclear moments in a volume element, a net magnetization M0 is hereby achieved that likewise precesses with the Lamor frequency. In thermal equilibrium M0 is directed parallel to B0. If a magnetic, radio-frequency alternating field (which should be generated optimally homogeneous according to the present invention) with the flux density B1 is now applied that oscillates with the Lamor frequency (in resonance) and acts for a time interval Δt, the magnetization vector is deflected by an angle α counter to the B0 field direction. The angle α is designated as a flip angle. If one is located in a coordinate system rotating around the B0 field direction with the Lamor frequency, it thus applies for the temporal change of the magnetization M that:

$$\frac{\delta \vec{M}}{\delta t} = \gamma \cdot \vec{M} \times \vec{B1}$$

If B1 is constant for the time interval Δt, it applies for the flip angle α that:

$A=\gamma \cdot B1 \cdot \Delta t$, whereby B1 is the magnitude.

The flip angle alpha is the angle between the magnetization vector M and the B0 vector. The flux density B1 exhibits a spatial distribution across the examination volume. Both the amplitude and the phase angle are spatially dependent. Different magnetizations Ma and Mb are therewith obtained at various points a and b in the examination volume after the action of the B1 field for the duration Δt.

The angle of the magnetization Ma or, respectively, Mb relative to the B0 field vector is meant by a flip angle amplitude. The angle of the program of M on the vertical plane relative to the B0 field vector is meant by a phase of the flip angle. If a coordinate system forms the basis, the B0 field vector would be directed in the direction of the z-axis; the x-axis and the y-axis that span the x-y plane are situated perpendicular to this. This means that the flip angle amplitude would be the magnetization angle relative to the z-axis while the phase of the flip angle is the angle of the projection of the respective magnetization at the respective points on the x-y plane with the x-axis. Since both angles are spatially-dependent, both a flip angle distribution (amplitude of the flip angle) and a phase angle distribution of the flip angle are obtained.

According to the invention, due to the sub-pulse excitation the flip angle distribution is developed in steps, meaning that the flip angle builds more strongly from pulse to pulse. Overall the flip angle distribution α(r) results as follows after a temporally-sequential activation with the sets Sn with a pulse duration $\tau_n$ and the phase shift $\phi_n$:

$$\alpha(\vec{r}) \propto \sum_n \int_0^{\tau_n} B1_{S_n}(\vec{r}, t) \cdot e^{i\phi_n} dt$$

FIG. 4 shows as a principle drawing the development of the magnetization that is based on a step-by-step development of the flip angle using three exemplary individual pulses. A patient 3 is shown as well as an examination volume U in which an optimally homogeneous magnetization should be generated. The magnetic field is naturally also generated in another region of the patient 3; however, because the image acquisitions should ensue in the examination volume, only there is a homogeneous magnetization also necessary.

If the first sub-pulse S1 is now applied, a first magnetization M1 thus develops in the examination volume U. Also shown are local heating areas 11, what are known as hot spots, thus areas of high energy application and therewith high local power loss that are of relevance with regard to the local SAR exposure.

After the passage of the excitation time $t_1$, the volume U is excited with the sub-pulse S2 which is based on a different parameter set. The total magnetization M2 (that is represented by the increasing striping) results is [sic] stronger than the magnetization obtained with the sub-pulse S1. This is achieved due to the constructive field superimposition and the constructive addition of the flip angle increase. The sub-pulse S2 in turn leads to local energy applications 12, however these clearly are situated at different points; they thus do not coincide with the energy applications 11. This means that they do not reinforce one another; the local energy application is respectively distinctly lower than is allowed in terms of exposure.

After expiration of the excitation with the sub-pulse S2, the excitation with the sub-pulse S3 is continued; the total magnetization M3 further intensifies. Pulse-specific local energy application centers also are associated with this sub-pulse, which pulse-specific local energy application centers are in turn clearly situated at different locations than the applications caused by the sub-pulses S1 and S2.

By this excitation on a sub-pulse-by-sub-pulse basis, the total magnetization in the examination volume U can be built up without leading to a local unacceptably high energy application.

FIG. 5 shows the sequential excitation of individual sub-regions of the examination volume to form a total magnetization. Also shown are the patient 3 as well as the examination volume U that is sub-divided into a number (in the shown example, 3) of sub-volumes SU1, SU2 and SU3.

The excitation in the sub-volume SU1 ensues with the first sub-pulse S1; also shown are the locations of high local energy application associated with the sub-pulse S1. The excitation of the sub-region SU2 ensues with the sub-pulse S2; here as well a sub-region-specific magnetization develops as is shown by the striping. Pulse-specific centers of high energy application 12 are also associated with this sub-pulse S2. In the sub-region SU3 the magnetization is finally developed by the sub-pulse S3, as is represented by the striping. Also shown are the centers of high energy application 13 associated with the sub-pulse S3.

Each sub-pulse thus develops a transversal magnetization, meaning that it leads to a flip angle dependent on the excitation in one of the sub-regions. It simultaneously leads to centers of high local power loss that can be situated within and outside of the examination volume U. By the combination of the various sub-pulses the magnetization is now developed in the entire examination volume U, as is shown by the lower representation in which the individual magnetizations of the sub-pulse-specific excitations are shown combined. However, the locations of the energy applications clearly do not also coincide here and do not mutually reinforce.

FIG. 5 shows the usage of only one individual pulse for respectively one specific sub-volume. The further excitation furthermore ensues sequentially in each sub-region as described in the preceding, meaning that the area SU1 is subsequently excited with a different sub-pulse; the same correspondingly applies for the other sub-volumes. Finally, it is to be noted that naturally the respective area excitation does not ensue sharply delimited; rather, each sub-pulse also develops a transversal magnetization outside of the sub-volume associated with it. However, because the sub-pulses are selected such that the flip angle amplitude distribution is similar in each sub-region, a total magnetization that is extremely homogeneous arises in the examination volume.

Although modifications and changes may be suggested by those skilled in the art, it is the invention of the inventor to embody within the patent warranted heron all changes and modifications as reasonably and properly come within the scope of his contribution to the art.

I claim:

1. A method for generating a homogenous magnetization in a spatial examination volume of a magnetic resonance system during examination of a subject located in the examination volume, said magnetic resonance system comprising a whole-body antenna comprising a plurality of resonator segments that are electromagnetically decoupled from each other, and a control and evaluation device connected to said plurality of resonator segments, said method comprising the steps of:

storing predetermined, segment-specific excitation parameters for the respective resonator segments of said single whole-body antenna in said control and evaluation device;

with said control and evaluation device, separately activating said plurality of resonator segments of said whole-body antenna corresponding to said excitation parameters in a temporal sequence within a single magnetic resonance excitation sequence using different sets of said excitation parameters, with each set of excitation parameters producing a different phase distribution of the nuclear magnetization distributions in the examination volume, to cause said nuclear magnetization distributions to constructively overlap to form a homogenous total nuclear magnetization distribution in said examination volume resulting from said single excitation sequence, and using a number of said different parameter sets to cause local power losses, introduced into the examination volume in said single excitation sequence as a consequence of activation of the respective segments with said parameter sets, to be locally differently situated in the patient, with said local power losses not coinciding and not mutually reinforcing during said single excitation sequence.

2. A method as claimed in claim 1 wherein the step of storing said plurality of sets of predetermined, segment-specific excitation parameters comprises generating said sets of excitation parameters dependent on a homogeneity of a magnetic field produced by the parameter set, and comprising selecting the parameter sets used in said excitation sequence dependent on said homogeneity.

3. A method as claimed in claim 1 wherein said examination volume comprises a plurality of sub-volumes, and comprising, for each sub-volume, using a plurality of different excitation parameter sets for sequential activation of said resonator segments.

4. A method as claimed in claim 3 comprising selecting said excitation parameter sets to cause flip angle amplitudes in the respective sub-region to be optimally large, and having respective flip angle phase distributions in said examination volume allowing for said constructive overlapping.

5. A method as claimed in claim 4 comprising determining at least one of an amplitude of an excitation parameter set and an excitation duration used with an excitation parameter set, and a phase shift of an excitation parameter set, to produce a substantially homogenous flip angle amplitude distribution in said examination volume.

6. A method as claimed in claim 3 comprising selecting said excitation parameter sets to cause flip angle amplitudes in the respective sub-region to be homogenous, and having respective flip angle phase distributions in said examination volume allowing for said constructive overlapping.

7. A method as claimed in claim 6 comprising determining at least one of an amplitude of an excitation parameter set and an excitation duration used with an excitation parameter set, and a phase shift of an excitation parameter set, to produce a substantially homogenous flip angle amplitude distribution in said examination volume.

8. A magnetic resonance system comprising:

a magnetic resonance scanner having a whole-body antenna therein comprised of a plurality of resonator segments that are electromagnetically decoupled from each other;

a control and evaluation device connected to said plurality of resonator segments;

said control and evaluation device storing predetermined, segment-specific excitation parameters for the respective resonator segments; and said control and evaluation device separately activating said plurality of resonator segments of said whole-body antenna corresponding to said excitation parameters in a temporal sequence within a single magnetic resonance excitation sequence using different sets of said excitation parameters, with each set of excitation parameters producing a different phase distribution of the nuclear magnetization distributions in the examination volume, to cause said nuclear magnetization distributions to constructively overlap to form a homogenous total nuclear magnetization distribution in said examination volume resulting from said single excitation sequence, and using a number of said different parameter sets to cause local power losses, introduced into the examination volume in said single excitation sequence as a consequence of activation of the respective segments with said parameter sets, to be locally differently situated in the patient, with said local power losses not coinciding and not mutually reinforcing during said single excitation sequence.

* * * * *